(12) United States Patent
Liou et al.

(10) Patent No.: US 7,015,553 B2
(45) Date of Patent: Mar. 21, 2006

(54) COMPACT MASK PROGRAMMABLE ROM

(75) Inventors: Jhyy-Cheng Liou, Jubei (TW); Chin-Hsi Lin, Hsinchu (TW)

(73) Assignee: Solid State System Co., Ltd., Hsinchu (TW)

( * ) Notice: Subject to any disclaimer, the term of this patent is extended or adjusted under 35 U.S.C. 154(b) by 170 days.

(21) Appl. No.: 10/478,017

(22) PCT Filed: Aug. 26, 2002

(86) PCT No.: PCT/IB02/03454

§ 371 (c)(1),
(2), (4) Date: Nov. 12, 2003

(87) PCT Pub. No.: WO2004/019409

PCT Pub. Date: Mar. 4, 2004

(65) Prior Publication Data

US 2004/0217379 A1    Nov. 4, 2004

(51) Int. Cl.
*H01L 29/76* (2006.01)
*G11C 17/00* (2006.01)

(52) U.S. Cl. .................... 257/390; 257/391; 365/103; 365/104

(58) Field of Classification Search ................ 257/390, 257/391, 379, 536; 365/103, 104, 182
See application file for complete search history.

(56) References Cited

U.S. PATENT DOCUMENTS 4,151,020 A * 4/1979 McElroy .................... 438/275
2004/0217379 A1 * 11/2004 Liou et al. .................. 257/200

* cited by examiner

*Primary Examiner*—Mark V. Prenty
(74) *Attorney, Agent, or Firm*—J.C. Patents (57) ABSTRACT

A compact mask programmable read-only memory (Mask ROM) is described, comprising a plurality of word lines, a plurality of bit lines, and a plurality of MOS-type and diffusion-type memory cells arranged in an array. The memory cells in one column are coupled to one bit line, and the gates of the MOS-type cells in one row are coupled to one word line via contacts, wherein two columns of memory cells share a column of contacts. A MOS-type cell shares its source and drain with two memory cells in the same column, and a diffusion-type cell directly connects with the diffusions of two adjacent memory cells. A constant number of continuous memory cells are grouped as a memory string, wherein the two diffusions of the two terminal memory cells are electrically connected to a bank select transistor and a ground line, respectively.

46 Claims, 8 Drawing Sheets

COMPACT MASK PROGRAMMABLE ROM

BACKGROUND OF THE INVENTION

1. Field of Invention

The present invention relates to a semiconductor device. More particularly, the present invention relates to a compact mask programmable read-only memory (Mask ROM).

2. Description of Related Art

Read-only memory (ROM) is a type of non-volatile memory, which can retain data as disconnected from power supply and is therefore used to store permanent data, such as booting data of computer systems.

In order to simplify the fabricating processes and to increase the integration of ROM devices, various ROM structures are proposed based on shared diffusion and integration of the coding process and the contact process. Some conventional ROM devices are described below.

Figure 1:
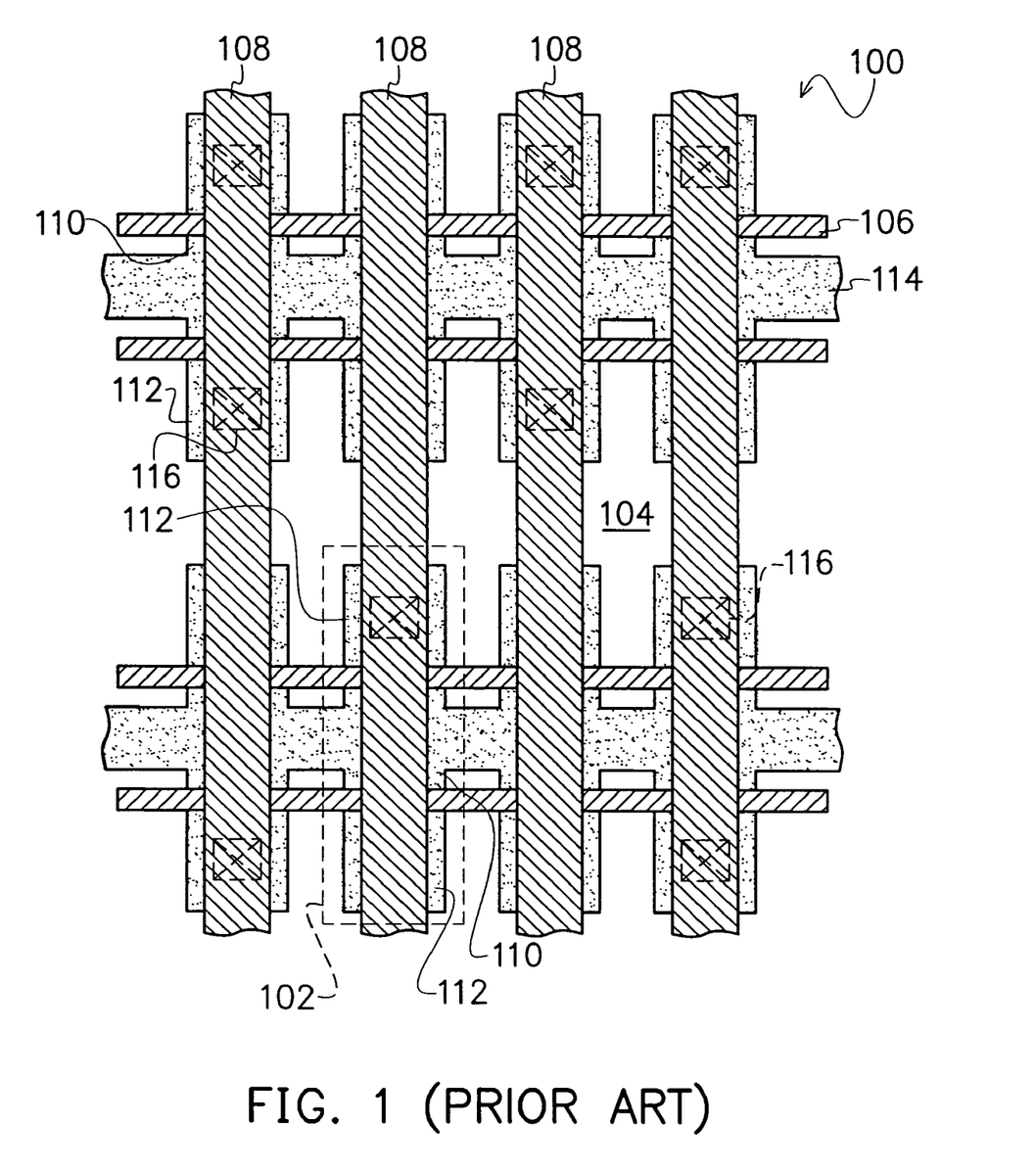
FIG. 1 illustrates a top view of a contact ROM in the prior art.

FIG. 1 illustrates a top view of a contact ROM in the prior art.

Refer to FIG. 1, the contact ROM 100 comprises rows and columns of MOS-type memory cells, wherein two adjacent memory cells in the same column constitute a cell pair 102 that is isolated by field isolation 104. The memory cells in the same row are controlled by a word line 106, and the memory cells in the same column are located under a bit line 108. The two memory cells in a cell pair 102 share a source 110 between the two drains 112 thereof, while the sources 110 of the cell pairs 102 in the same row are electrically connected to a ground line 114. In the contact ROM 100, a plurality of contacts 116 are selectively formed on the drains 112 of the memory cells as data codes, wherein the contacts in the same column are connected to a bit line 108.

During a reading operation of the contact ROM, the selected word line 106 is biased to high level. If the drain 112 of the selected memory cell has a contact 116 thereon electrically connecting with the selected bit line 108, a current can be conducted from the selected bit line 108 to the ground line 114 connecting with the source 110 of the selected memory cell. Otherwise, no current is detected. In other words, the data is stored as a contact pattern. However, since the field isolation 104 is formed between two rows of cell pairs 102 and contacts 116 are formed on the drains 112, the area of the memory array is large and the device integration is low.

Figure 2:
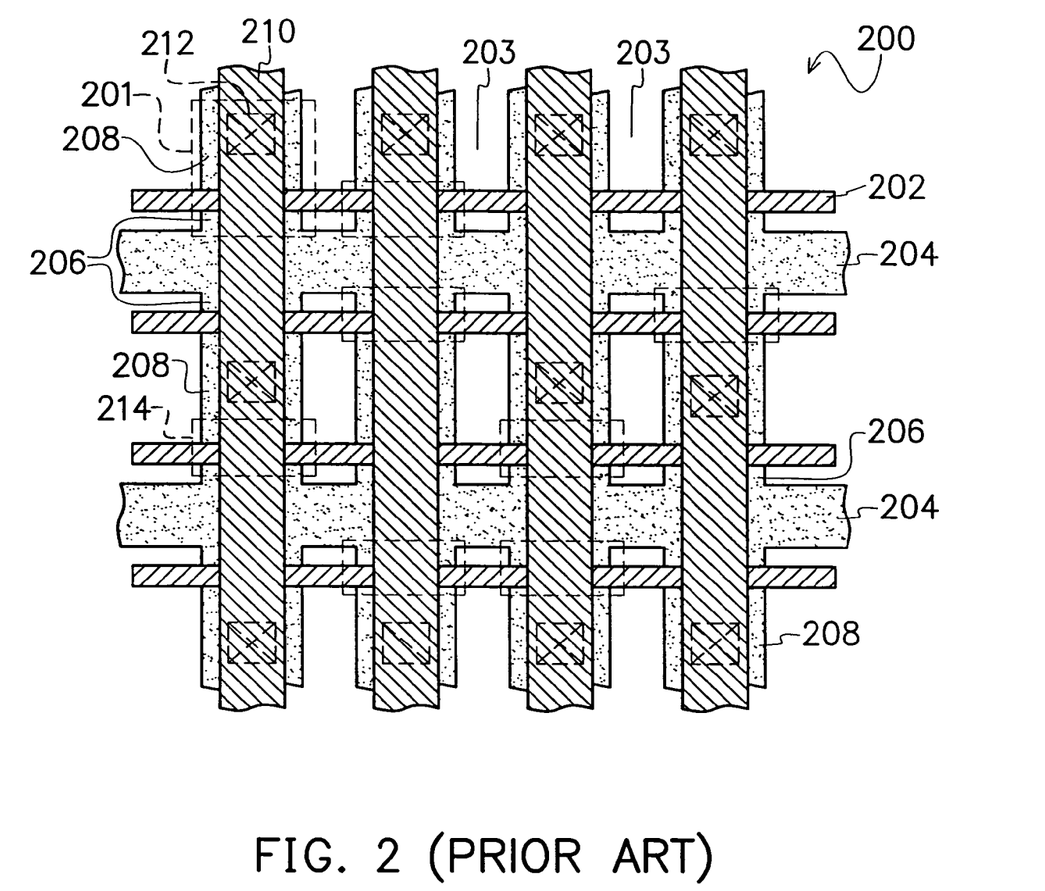
FIG. 2 illustrates a top view of an implant programmable ROM in the prior art.

FIG. 2 illustrates a top view of an implant programmable ROM in the prior art.

Refer to FIG. 2, the implant programmable ROM 200 comprises rows and columns of MOS-type memory cells 201. The memory cells in the same row are controlled by a word line 202 and every two rows of memory cells 201 are coupled to a ground line 204, while two columns of memory cells 201 are separated by isolation 203. A memory cell 201 shares a source 206 with one adjacent memory cell in the same column, and shares a drain 208 with the other adjacent memory cell in the same column. The sources 206 of the memory cells 201 in the same row are connected to a ground line 204, and the drains 208 of the memory cells 201 in the same column are electrically connected to a bit line 210 via contacts 212. The implant programmable ROM 200 is programmed by selectively implanting ions into the channel regions under the word lines 202 to make the selected channel regions 214 have a higher threshold voltage ($V_T$). During the reading operation of the implant programmable ROM, the selected word line 202 is biased to high level. If the channel region of the selected memory cell 201 is not implanted, the channel can be switched on and an On-current can be detected, otherwise the channel cannot be switched on and the channel current is extremely small.

As compared with the contact ROM 100 in FIG. 1, the implant programmable ROM 200 is more compact because the isolation between rows of memory cells is omitted and a drain 208 is shared by two memory cells 201 like a source 206. However, since an additional mask is needed for selectively implanting the channel regions of the memory cells 201, the fabricating process is more complex. Moreover, in consideration of the lateral area necessary for forming the contacts 212, the degree of area reduction of the drain region 208 is limited and the memory array cannot be further miniaturized.

Figure 3:
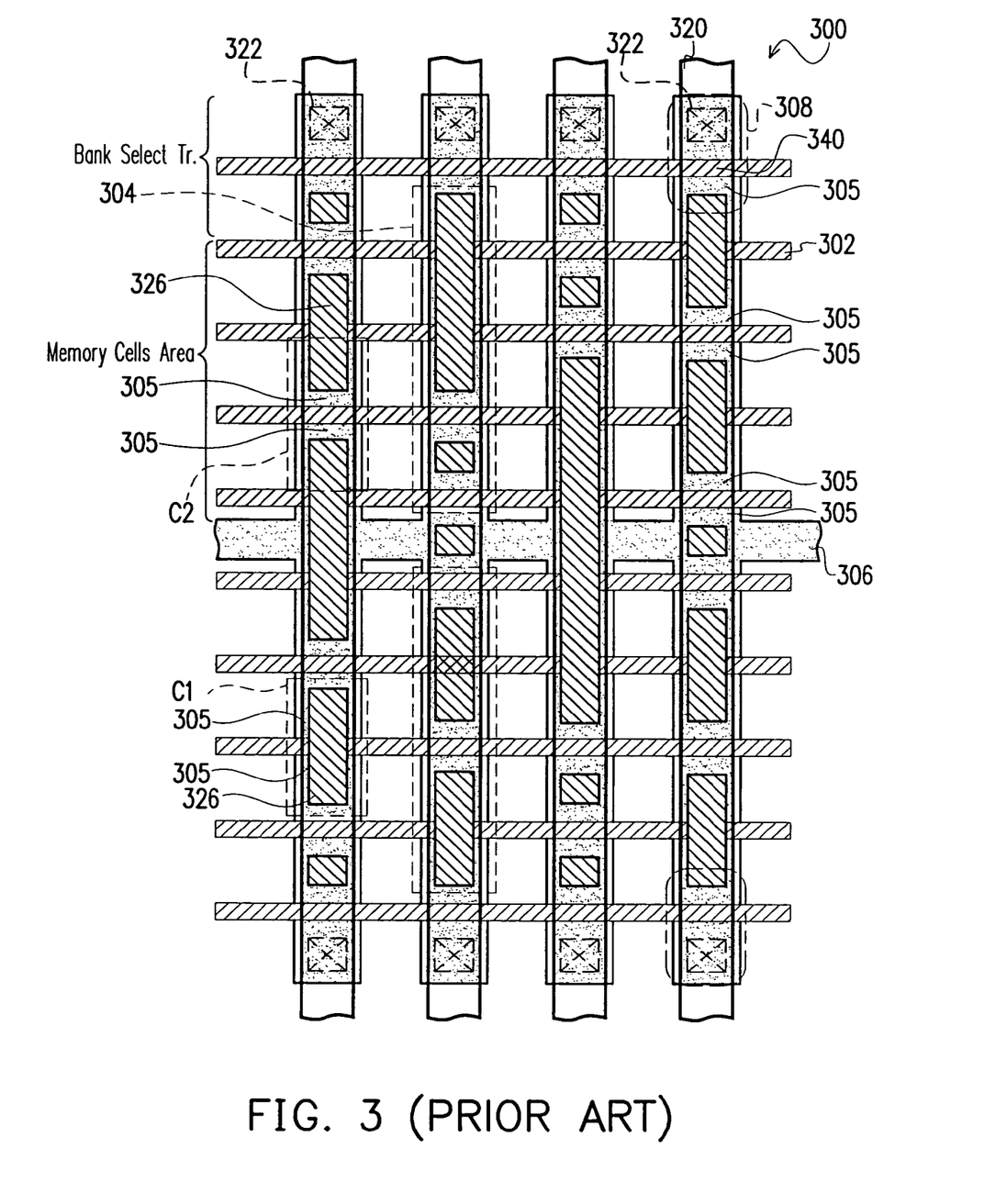
FIG. 3 illustrates a top view of a Metal ROM in the prior art.

FIG. 3 illustrates a top view of a Metal ROM in the prior art.

Refer to FIG. 3, the Metal ROM 300 has a NAND (NOT AND) structure and comprises rows and columns of MOS-type memory cells. The memory cells in the same row are controlled by a word line 302 and four continuous memory cells in the same column are grouped as a memory string 304. In a memory string 304, the diffusion 305 of one terminal memory cell is electrically connected to a ground line 306, and the diffusion 305 of the other terminal memory cell is coupled to a bank select transistor 308. The bank select transistor 308 is coupled to a bit line 320 parallel to the memory string 304 via a contact 322. The source and the drain of a memory cell, i.e., the two diffusions 305 of a memory cell, are both shared by adjacent cells.

The Metal ROM is programmed by selectively forming local interconnects 326 each connecting the two diffusions 305 of a selected memory cell. If a memory cell has a local interconnect 326 formed thereon like memory cell C1 does, the memory cell is always electrically conductible and acts like a depletion-type MOS devices, otherwise the memory cell is in the enhanced mode like memory cell C2 is. During a reading operation, the selected bit line 320 is coupled to a certain voltage level, the selected word line 302 is coupled to low level, and the unselected word lines 302 and the gate 340 of the bank select transistor 308 are coupled to high level. Thus, the bank select transistor 308 and all of the unselected memory cells in the same memory string 304 are switched on. Consequently, if the selected memory cell has a local interconnect 326 formed thereon, a current can be conducted through it and can be detected, otherwise no current is detected. The Metal ROM is more compact than the contact ROM, but the memory area in the Metal ROM cannot be further reduced because local interconnects must be formed on the diffusions 305 (sources and drains).

SUMMARY OF THE INVENTION

Accordingly, this invention provides a compact mask programmable read-only memory (Mask ROM) that has a smaller memory array for increasing device integration.

A compact Mask ROM of this invention comprises a memory cell array, wherein some memory cells are MOS transistors having a gate electrode and the other are resistors not having a gate electrode, which means that the gate electrodes serve as data codes. The gate electrodes of the MOS-type cells in the same row are coupled to a word line, and the memory cells in the same column are coupled to a bit line.

In the compact Mask ROM of this invention, a MOS-type cell has a source and a drain coupled with two adjacent memory cells in the same column, and a resistor-type cell is coupled with two adjacent memory cells in the same column. If the resistors are diffusions in the substrate or contain diffusions in the substrate, shared diffusions are used in the memory array. That is, a MOS-type memory cell shares its source and drain with two adjacent memory cells in the same column, while a resistor/diffusion-type cell directly connects with the diffusions of two adjacent memory cells.

Moreover, in one embodiment of this invention, a column of contacts are disposed between every two columns of memory cells, and no contact is formed on the memory cells. In the two columns of memory cells that share the same column of contacts, the gate electrode(s) of one or two MOS-type cell(s) among two memory cells in the same row is (are) connected to a word line via a contact if at least one of the two memory cells is a MOS-type cell. In other words, if the two memory cells in the same row are both resistor-type cells, they are not coupled to any word line.

In another embodiment of this invention, some memory cells in a column share a column of contacts with corresponding memory cells in one adjacent column of memory cells. The other memory cells in the same column share another column of contacts with corresponding memory cells in the other adjacent column of memory cells, wherein a gate electrode of a MOS-type cell is coupled to a word line via a contact. Preferably, the two columns of contacts beside one column of memory cells are disposed alternately. A contact is shared by a pair of memory cells in the same row, and no contact is formed on the memory cells.

As mentioned above, in the compact Mask ROM of this invention, the gate electrodes serve as data codes and contacts are not formed on the memory cells, while two columns of memory cells share one column of contacts. Therefore, the Mask ROM of this invention is the densest ROM based on current CMOS/Logic processes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

Figure 4A:
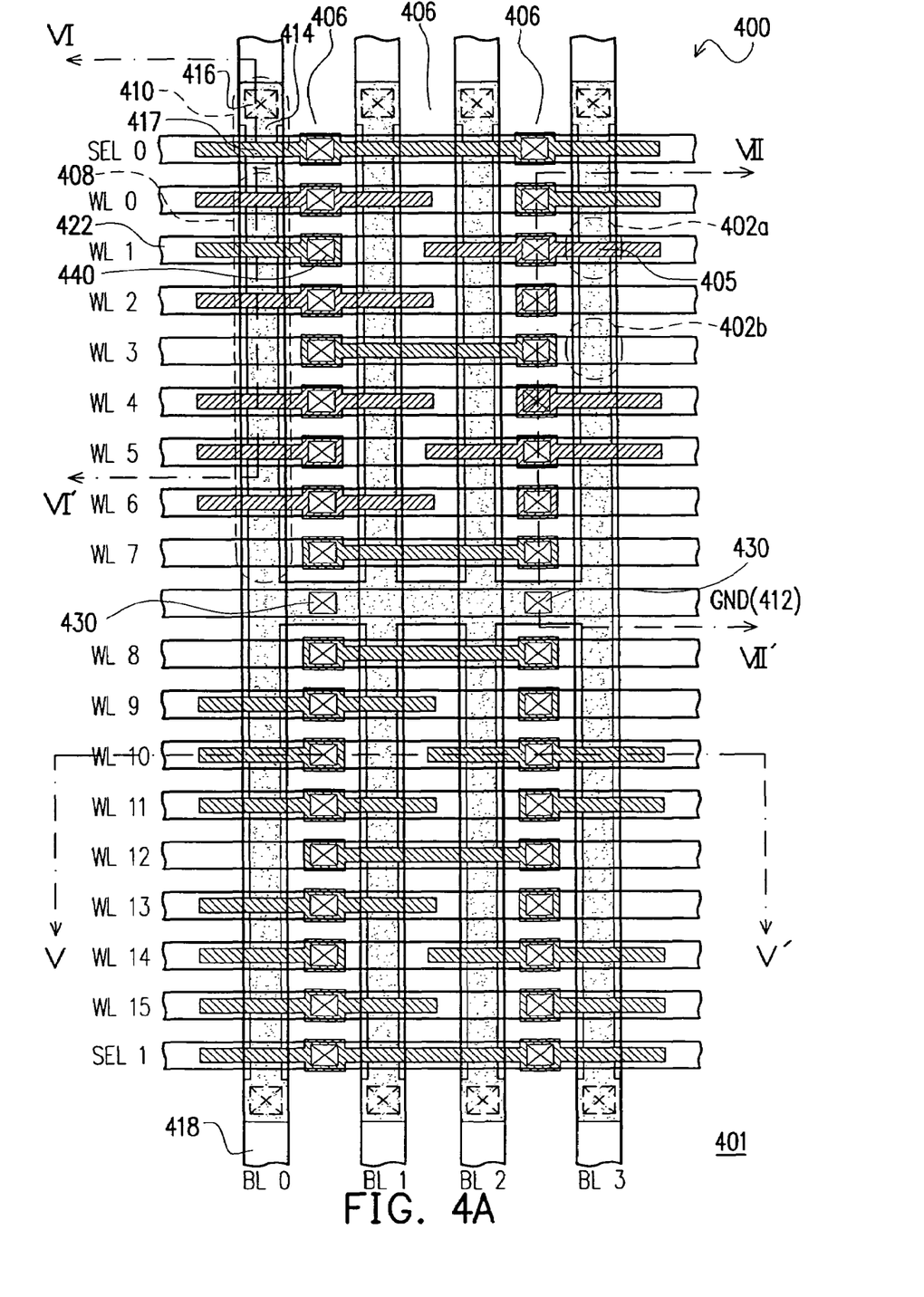
FIG. 4A illustrates a compact Mask ROM according to a first embodiment of this invention.
Figure 4B:
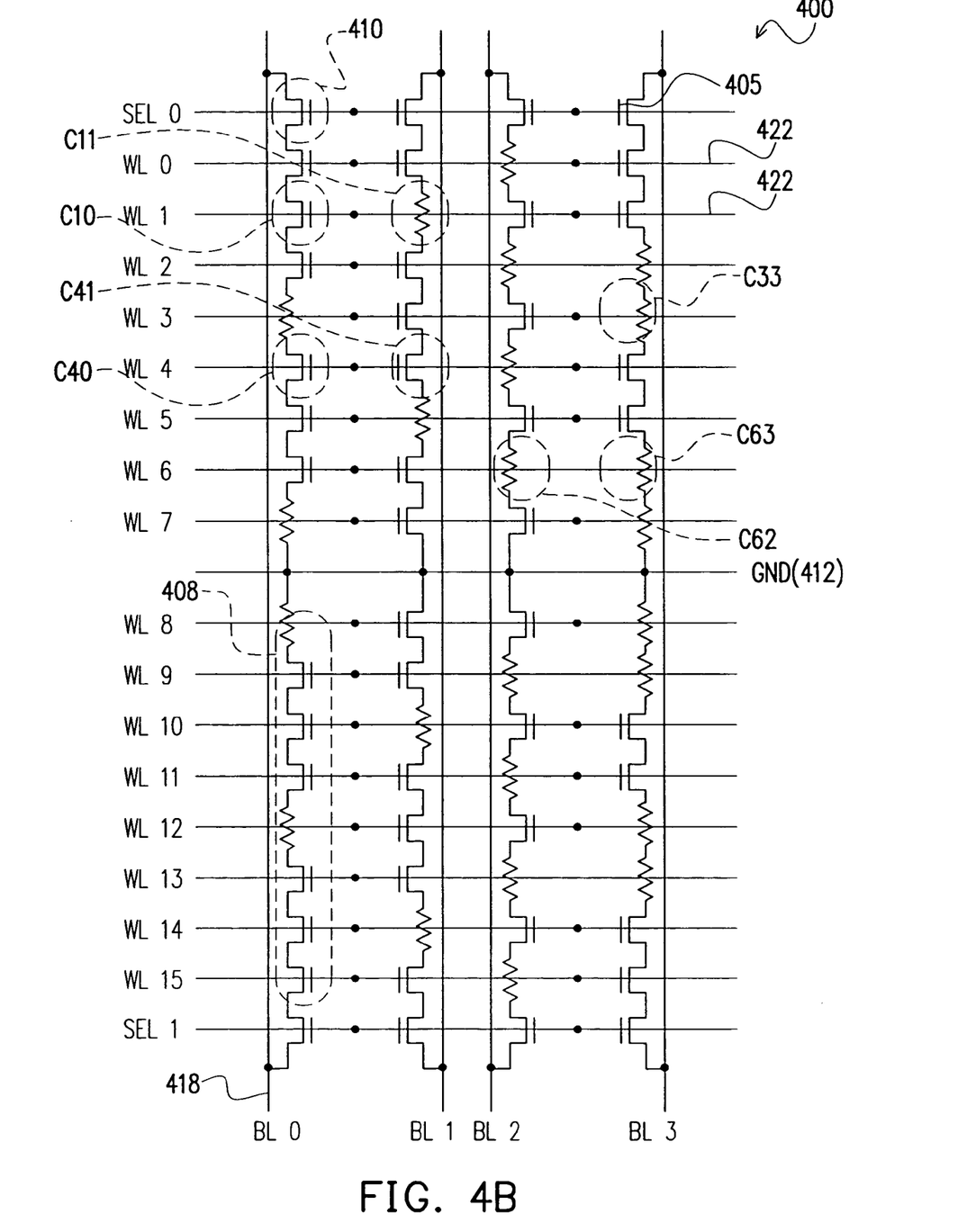
FIG. 4B illustrates the equivalent circuit of the compact Mask ROM.
Figure 5:
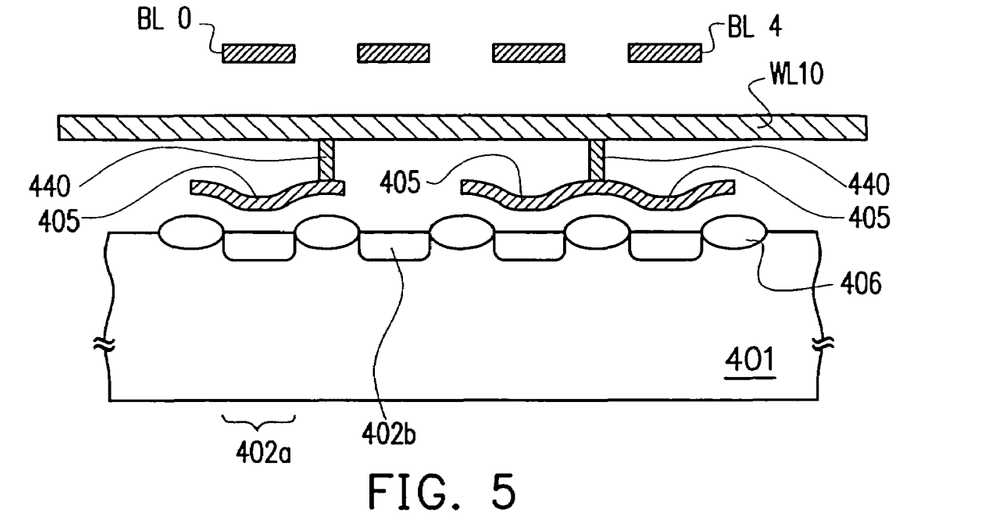
FIGS. 5, 6 and 7 illustrate three cross-sectional views of the Mask ROM in FIG. 4A along lines V–V', VI–VI' and VII–VII', respectively.
Figure 6:
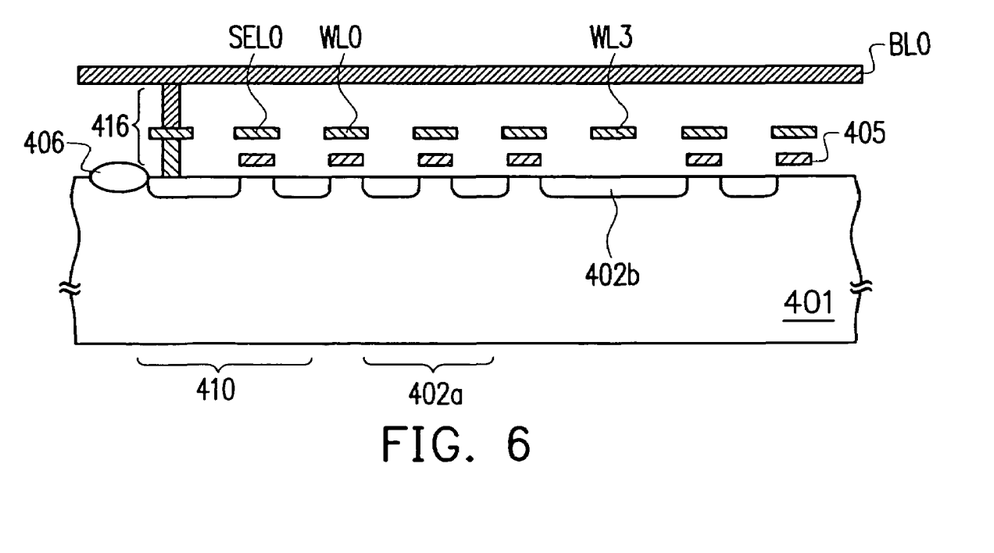
Figure 7:
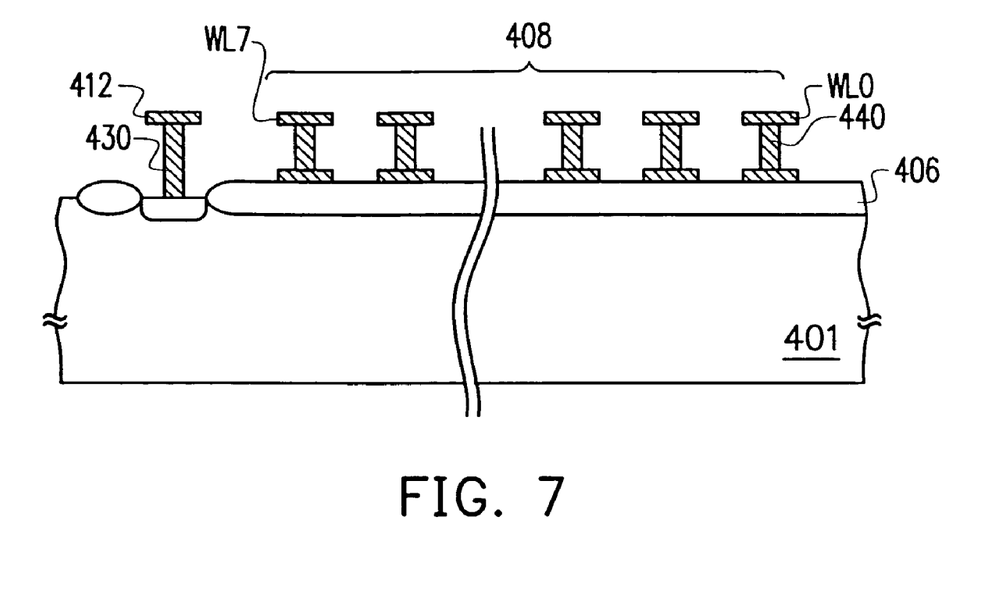

FIG. 4A illustrates a gate Mask ROM according to the first embodiment of this invention, and FIG. 4B illustrates the equivalent circuit of the compact Mask ROM to display the electrical connections between all components more clearly. Meanwhile, FIGS. 5, 6 and 7 illustrate three cross sections of the Mask ROM in FIG. 4 along lines V–V', VI–VI' and VII–VII', respectively, in order to further explain the embodiment.

Refer to FIGS. 4A, 4B and 5~7, the Mask ROM 400 in the embodiment of this invention has a NAND structure. Some memory cells are MOS transistors (MOS-type cell) 402a having a gate electrode 405, such as C10 and C40, and the others are diffusion resistors (diffusion-type cell) 402b, such as C11 and C33, wherein the gate electrode 405 comprises a material such as doped polysilicon. Two columns of memory cells 402a/b are separated by field isolation 406 formed on the substrate 401, and eight continuous memory cells 402a/b in the same column are grouped as a memory string 408. In each memory string 408, one terminal memory cell 402a/b is coupled to a bank select transistor 410, and the other terminal memory cell 402a/b is coupled to a ground line 412 via a contact 430. A diffusion 414 of the bank select transistor 410 is electrically connected to a bit line 418 parallel to the memory string 408 via a two-level contact 416, and the gate 417 of the bank select transistor 410 is electrically connected to a select line SEL0 or SEL1 extending in the row direction. The ground line 412 is shared by two rows of memory strings 408. The bit lines 418 and the ground line 412 comprise metal, for example.

Refer to FIGS. 4B and 7 again, the MOS-type cells include memory cells C10, C40 and C41, etc., and the diffusion-type cells include memory cells C11, C33, C62 and C63, etc., wherein the gates 405 of the MOS-type cells in the same row are coupled to a word line 422. The word line 422 comprise metal, for example. A diffusion of one terminal memory cell 402a/b in a memory string 408 is shared by the bank select transistor 410 in the same memory string 408, and a diffusion of the other terminal memory cell 402a/b is connected to the ground line 412 via a contact 430 (FIG. 7). The source/drain (diffusions) of a MOS-type memory cell, such as C10 or C40, is shared by an adjacent MOS-type cell 402a, or directly connects with a diffusion-type cell 402b. A diffusion-type memory 402b, such as C33, C62 or C63, directly connects with the source(s)/drain(s) of one or two adjacent MOS-type cells 402a or with one or two adjacent diffusion-type cell(s) 402b.

Refer to FIGS. 4A, 4B and 5~7 again, a column of contacts 440 are disposed between the two memory strings 408 coupled to BL0 and BL1 (or BL2 and BL3), respectively. If one of the two memory cells in the same row is a MOS-type cell 402a like the case of C10 and C11, or the two memory cells are both MOS-type cells 402a like the case of C40 and C41, the gate electrode(s) thereof is (are) connected to a word line 422 via a contact 440 disposed on the field isolation 406. If the two memory cells in a row are both diffusion-type memory cells, such as C62 and C63, they are not coupled with any word line 422.

Reading Operation of the Mask ROM

Refer to FIG. 4B, when the data stored in memory cell C10 is being read, the select line SEL0 is biased to high level to switch on the bank select transistor 410 coupled to the corresponding memory string 408. The unselected word lines WL0 and WL2~7 in the same memory string 408 are also biased to high level to switch on the MOS-type cells 402a coupled to them. The selected word line WL1 is biased to low level, and the selected bit line BL0 is coupled to $V_{cc}$. Since the gate 405 of memory cell C10 is biased to low level, memory cell C10 is not switched on and therefore blocks a current from bit line BL0 to the ground line 412.

Similarly, when the data stored in memory cell C11 is being read, the select line SEL1 is biased to high level to switch on the bank select transistor 410 coupled to the corresponding memory string 408. The unselected word lines WL0 and WL2~7 are biased to high level to switch on the MOS-type cells 402a coupled to them. The selected word line WL1 is biased to low level, and the selected bit line BL1 is coupled to $V_{cc}$. Since memory cell C11 is a diffusion region, a current can be conducted from BL1 to the ground line 408 through memory cell C11 and the other MOS-type and diffusion-type memory cells 402a/b to be detected. Therefore, the data stored in C10 is read as 0 (or 1) and that in C11 is read as 1 (or 0).

Second Embodiment

Figure 8:
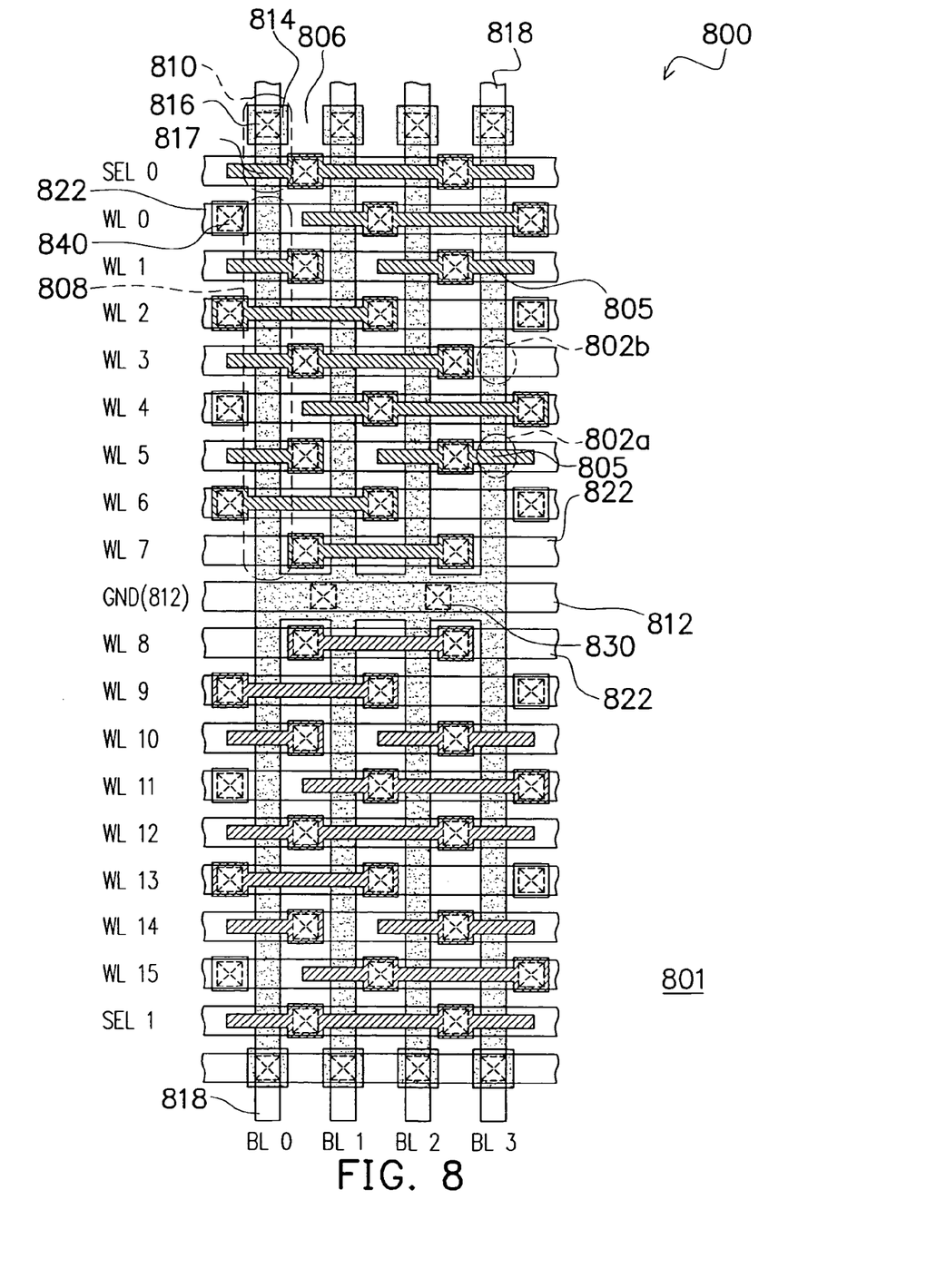
FIG. 8 illustrates a compact Mask ROM according to a second embodiment of this invention.

Refer to FIG. 8, the Mask ROM 800 in the second embodiment of this invention also has a NAND structure. Some memory cells are MOS transistors (MOS-type cell) 802a having a gate electrode 805, and the others are diffusion resistors (diffusion-type cell) 802b, wherein the gate electrode 805 comprises a material such as doped polysilicon. Two columns of memory cells 802a/b are separated by field isolation 806 formed on the substrate 801, and eight continuous memory cells 802a/b in the same column are grouped as a memory string 808. In each memory string 808, one terminal memory cell 802a/b is coupled to a bank select transistor 810, and the other terminal memory cell 802a/b is coupled to a ground line 812 via a contact 830. A diffusion 814 of the bank select transistor 810 is electrically connected to a bit line 818 parallel to the memory string 808 via a two-level contact 816, and the gate 817 of the bank select transistor 810 is electrically connected to a select line SEL0 or SEL1 extending in the row direction. The ground line 812 is shared by two rows of memory strings 808. The bit lines 818 and the ground line 812 comprise metal, for example.

Refer to FIG. 8 again, the gates 805 of the MOS-type cells 802a in the same row are coupled to a word line 822, which comprises a material such as metal. A diffusion of one terminal memory cell 802a/b in a memory string 808 is shared by the bank select transistor 810 in the same memory string 808, and a diffusion of the other terminal memory cell 802a/b is connected to the ground line 812 via a contact 830 (FIG. 7). The source/drain (diffusions) of a MOS-type memory cell 802a is shared by an adjacent MOS-type cell 802a, or directly connects with a diffusion-type cell 802b. A diffusion-type memory 802b directly connects with the source(s)/drain(s) of one or two adjacent MOS-type cells 802a or with one or two adjacent diffusion-type cell(s) 802b.

Refer to FIG. 8 again, a column of contacts 840 are disposed between any two adjacent memory strings 808, and no contact is formed on the diffusion regions of the memory cells 802a/b, while the two columns of contacts 840 beside one memory string 808 are disposed alternately. The gate electrode(s) 805 of one or two MOS-type cell(s) 802a among two memory cells 802a/b in the same row is (are) connected to a word line 822 via a contact 840 if at least one of the two memory cells is a MOS-type cell 802a. If the two adjacent memory cells 802a/b in the same row are both diffusion-type memory cells 802b, they are not coupled with any word line.

As mentioned above, in the compact mask programmable ROM according to two embodiments of this invention, the gate electrodes 405 (805) serve as data codes and the diffusion contacts of the memory cells are omitted, while two columns of memory cells share one column of contacts 440 (840) on the field isolation 406 (806). Therefore, the Mask ROM of this invention is the densest ROM based on current CMOS/Logic processes.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A mask programmable read-only memory (Mask ROM), comprising:
    a plurality of memory cells, including a plurality of MOS-type cells having a gate electrode, and a plurality of resistor-type cells not having a gate electrode;
    a plurality of word lines coupled to the gate electrodes of the MOS-type cells for controlling the MOS-type cells; and
    a plurality of bit lines coupled to the memory cells,
    wherein the memory cells are arranged in rows and columns and the gate electrodes of the MOS-type cells in one row are coupled to one word line, and the memory cells in one column are coupled to one of the bit lines.

2. The Mask ROM of claim 1, wherein the gate electrodes comprise doped polysilicon.

3. The Mask ROM of claim 1, wherein each of the resistor-type cells comprises a diffusion.

4. The Mask ROM of claim 1, wherein the word lines and the bit lines comprise metal.

5. The Mask ROM of claim 1, wherein
    two columns of memory cells share a column of contacts; and
    the gate electrode(s) of one or two MOS-type cell(s) among two memory cells in the two columns and in the same row is (are) electrically connected to a word line via a contact.

6. The Mask ROM of claim 1, wherein
    some memory cells in a column share a column of contacts with one adjacent column of memory cells;
    the other memory cells in the same column share another column of contacts with the other adjacent column of memory cells; and
    a gate electrode of a MOS-type cell is electrically connected to a word line via a contact.

7. The Mask ROM of claim 6, wherein two columns of contacts beside one column of memory cells are disposed alternately.

8. The Mask ROM of claim 1, wherein two columns of memory cells are separated by an isolation layer.

9. The Mask ROM of claim 1, wherein
    a MOS-type cell has a source and a drain coupled with two adjacent memory cells in the same column; and
    a resistor-type cell is coupled with two adjacent memory cells in the same column.

10. The Mask ROM of claim 9, wherein
    a constant number of continuous memory cells are grouped as a memory string, wherein one terminal memory cell is coupled to a bank select transistor, and the other terminal memory cell is coupled to a ground line.

11. The Mask ROM of claim 10, wherein a gate of the bank select transistor is coupled to a select line.

12. The Mask ROM of claim 10, wherein the other terminal memory cell is coupled to the ground line via a contact.

13. The Mask ROM of claim 10, wherein two rows of memory strings share a ground line.

14. The Mask ROM of claim 10, wherein the constant number is 8.

15. A mask programmable read-only memory (Mask ROM), comprising:
a plurality of memory cells, including a plurality of MOS-type cells having a gate electrode, and a plurality of diffusion-type cells not having a gate electrode;
a plurality of word lines coupled to the gate electrodes of the MOS-type cells for controlling the MOS-type cells; and
a plurality of bit lines coupled to the memory cells,
wherein the memory cells are arranged in rows and columns, and the gate electrodes of the MOS-type cells in one row are coupled to one word line, and the memory cells in one column are couple to one of the bit lines.

16. The Mask ROM of claim 15, wherein the gate electrodes comprise doped polysilicon.

17. The Mask ROM of claim 15, wherein the word lines and the bit lines comprise metal.

18. The Mask ROM of claim 15, wherein
two columns of memory cells share a column of contacts; and
the gate electrode(s) of one or two MOS-type cell(s) among two memory cells in the two columns and in the same row is (are) electrically connected to a word line via a contact.

19. The Mask ROM of claim 15, wherein
some memory cells in a column share a column of contacts with one adjacent column of memory cells;
the other memory cells in the same column share another column of contacts with the other adjacent column of memory cells; and
a gate electrode of a MOS-type cell is electrically connected to a word line via a contact.

20. The Mask ROM of claim 19, wherein two columns of contacts beside one column of memory cells are disposed alternately.

21. The Mask ROM of claim 15, wherein two columns of memory cells are separated by an isolation layer.

22. The Mask ROM of claim 15, wherein a MOS-type cell shares a source and a drain thereof with two adjacent memory cells in the same column, and a diffusion-type cell directly connects with diffusions of two adjacent memory cells in the same column.

23. The Mask ROM of claim 22, wherein
a constant number of continuous memory cells are grouped as a memory string, wherein a diffusion of one terminal memory cell is electrically connected to a bank select transistor, and a diffusion of the other terminal memory cell is electrically connected to a ground line.

24. The Mask ROM of claim 23, wherein a gate of the bank select transistor is coupled to a select line.

25. The Mask ROM of claim 23, wherein the diffusion is electrically connected to the ground line via a contact.

26. The Mask ROM of claim 23, wherein two rows of memory strings share a ground line.

27. The Mask ROM of claim 23, wherein the constant number is 8.

28. A mask programmable read-only memory (Mask ROM) of NAND type, comprising a plurality of word lines, a plurality of bit lines, and a plurality of memory cells arranged in rows and columns, wherein
the memory cells include a plurality of MOS-type cells having a gate electrode, and a plurality of resistor-type cells not having a gate electrode;
the gate electrodes of the MOS-type cells in one row are coupled to one word line, and the memory cells in one column are coupled to one bit line;
a constant number of continuous memory cells are grouped as a memory string, wherein
a MOS-type cell has a source and a drain coupled with two adjacent memory cells in the same column, and a resistor-type cell is coupled to two adjacent memory cells in the same column; and
one terminal memory cell of the memory string is coupled to a bank select transistor, and the other terminal memory cell of the memory string is coupled to a ground line; and
two columns of memory cells share a column of contacts, and the gate electrode(s) of one or two MOS-type cell(s) among two memory cells in the two columns and in the same row is (are) electrically connected to a word line via a contact.

29. The Mask ROM of claim 28, wherein the gate electrodes comprise doped polysilicon.

30. The Mask ROM of claim 28, wherein each of the resistor-type cells comprises a diffusion.

31. The Mask ROM of claim 28, wherein the word line and the bit line comprise metal.

32. The Mask ROM of claim 28, wherein two columns of memory cells are separated by an isolation layer.

33. The Mask ROM of claim 28, wherein two rows of memory strings share a ground line.

34. The Mask ROM of claim 28, wherein the other terminal memory cell of each memory string is electrically connected to a ground line via a contact.

35. The Mask ROM of claim 28, wherein a gate of the bank select transistor is coupled to a select line extending in a row direction.

36. The Mask ROM of claim 28, wherein the constant number is 8.

37. A mask programmable read-only memory (Mask ROM) of NAND type, comprising a plurality of word lines, a plurality of bit lines, and a plurality of memory cells arranged in rows and columns, wherein
the memory cells include a plurality of MOS-type cells having a gate electrode, and a plurality of resistor-type cells not having a gate electrode;
the gate electrodes of the MOS-type cells in one row are coupled to one word line, and the memory cells in one column are coupled to one bit line;
a constant number of continuous memory cells are grouped as a memory string, wherein
a MOS-type cell has a source and a drain coupled with two adjacent memory cells in the same column, and a resistor-type cell is coupled with two adjacent memory cells in the same column; and
one terminal memory cell of the memory string is coupled to a bank select transistor, and the other terminal memory cell of the memory string is coupled to a ground line; and
some memory cells in a column share a column of contacts with one adjacent column of memory cells, and the other memory cells in the same column share another column of contacts with the other adjacent column of memory cells, wherein a gate electrode of a MOS-type cell is electrically connected to a word line via a contact.

38. The Mask ROM of claim 37, wherein two columns of contacts beside one column of memory cells are disposed alternately.

39. The Mask ROM of claim 37, wherein the gate electrode comprises doped polysilicon.

40. The Mask ROM of claim 37, wherein each of the resistor-type cells comprises a diffusion.

41. The Mask ROM of claim 37, wherein the word line and the bit line comprise metal.

42. The Mask ROM of claim 37, wherein two columns of memory cells are separated by an isolation layer.

43. The Mask ROM of claim 37, wherein two rows of memory strings share a ground line.

44. The Mask ROM of claim 37, wherein the other terminal memory cell of each memory string is electrically connected to a ground line via a contact.

45. The Mask ROM of claim 37, wherein a gate of the bank select transistor is coupled to a select line extending in a row direction.

46. The Mask ROM of claim 37, wherein the constant number is 8.

* * * * *